US009807839B1

(12) United States Patent
Gordin et al.

(10) Patent No.: US 9,807,839 B1
(45) Date of Patent: Oct. 31, 2017

(54) INTERMITTENT OVERDRIVE FOR SPORTS LIGHTING

(71) Applicant: Musco Corporation, Oskaloosa, IA (US)

(72) Inventors: Myron Gordin, Oskaloosa, IA (US); Timothy J. Boyle, Oskaloosa, IA (US)

(73) Assignee: Musco Corporation, Oskaloosa, IA (US)

( * ) Notice: Subject to any disclaimer, the term of this patent is extended or adjusted under 35 U.S.C. 154(b) by 1017 days.

(21) Appl. No.: 14/049,723

(22) Filed: Oct. 9, 2013

(51) Int. Cl.
*H05B 33/08* (2006.01)
*G06F 17/50* (2006.01)

(52) U.S. Cl.
CPC ......... *H05B 33/0848* (2013.01); *G06F 17/50* (2013.01)

(58) Field of Classification Search
CPC .............................. H05B 33/0848; G02F 17/50
USPC ....................................................... 362/234
See application file for complete search history.

(56) References Cited

U.S. PATENT DOCUMENTS

| 4,994,718 | A | 2/1991 | Gordin |
| 6,016,389 | A | 1/2000 | Crookham et al. |
| 6,681,110 | B1 | 1/2004 | Crookham et al. |
| 6,929,385 | B2 | 8/2005 | Gordin et al. |
| 7,176,635 | B2 | 2/2007 | Gordin et al. |
| 7,675,251 | B2 | 3/2010 | Gordin et al. |
| 7,778,635 | B2 | 8/2010 | Crookham et al. |
| 7,956,551 | B1 | 6/2011 | Gordin |
| 7,956,556 | B1 | 6/2011 | Gordin et al. |
| 7,982,404 | B2 | 7/2011 | Gordin |
| 8,098,024 | B1 | 1/2012 | Gordin |
| 8,356,916 | B2 | 1/2013 | Gordin et al. |
| 8,449,144 | B2 | 5/2013 | Boxler et al. |
| 8,508,152 | B1 | 8/2013 | Gordin et al. |
| 8,517,566 | B2 | 8/2013 | Gordin |
| 8,523,397 | B1 | 9/2013 | Gordin |
| 8,525,439 | B1 | 9/2013 | Gordin |
| 9,000,934 | B1 | 4/2015 | Gordin et al. |
| 2006/0176695 | A1 | 8/2006 | Gordin et al. |
| 2010/0097800 | A1* | 4/2010 | Ou Yang ................. F21S 8/086 362/235 |

(Continued)

OTHER PUBLICATIONS

Gordin et al., "Apparatus, Method and System for Monitoring and Maintaining Light Levels at Area for Lighting System" filed Dec. 21, 2007, U.S. Appl. No. 11/963,084.

*Primary Examiner* — Laura Tso
(74) *Attorney, Agent, or Firm* — McKee, Voorhees & Sease, PLC

(57) ABSTRACT

A method, apparatus, and system for operating wide area lighting systems. Operating costs, as well as capital and installation costs, can be reduced by designing the lighting system for operation of individual light sources at a first "normal" operating power for a majority of the time but having the ability to boost or increase operating power for "boosted" or increased light output for the same light sources of the system for a minority of cumulative operating time of the light sources. ""In one aspect, performance data about the LED light sources is evaluated relative to whether or not the light sources will have a predicted life expectancy on the order of the entire lighting system life expectancy. Operating power levels for boosted and normal LED lumen outputs are selected to comport with predictably meeting or exceeding lighting system life expectancy.

28 Claims, 10 Drawing Sheets

(56) References Cited

U.S. PATENT DOCUMENTS

2012/0081014 A1 4/2012 Blanchard et al.
2012/0307486 A1* 12/2012 Gordin .................... F21S 4/00
362/223

* cited by examiner

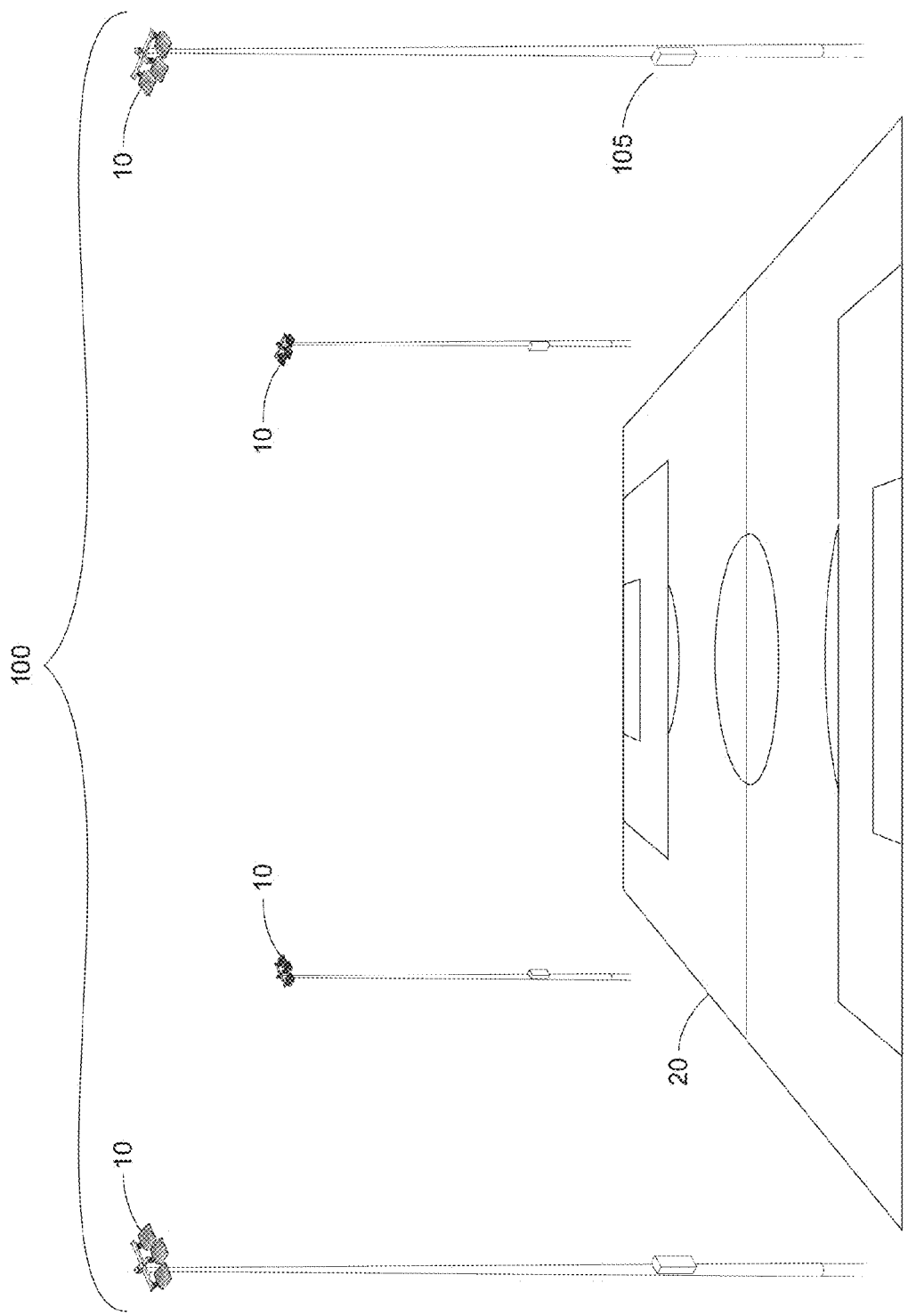

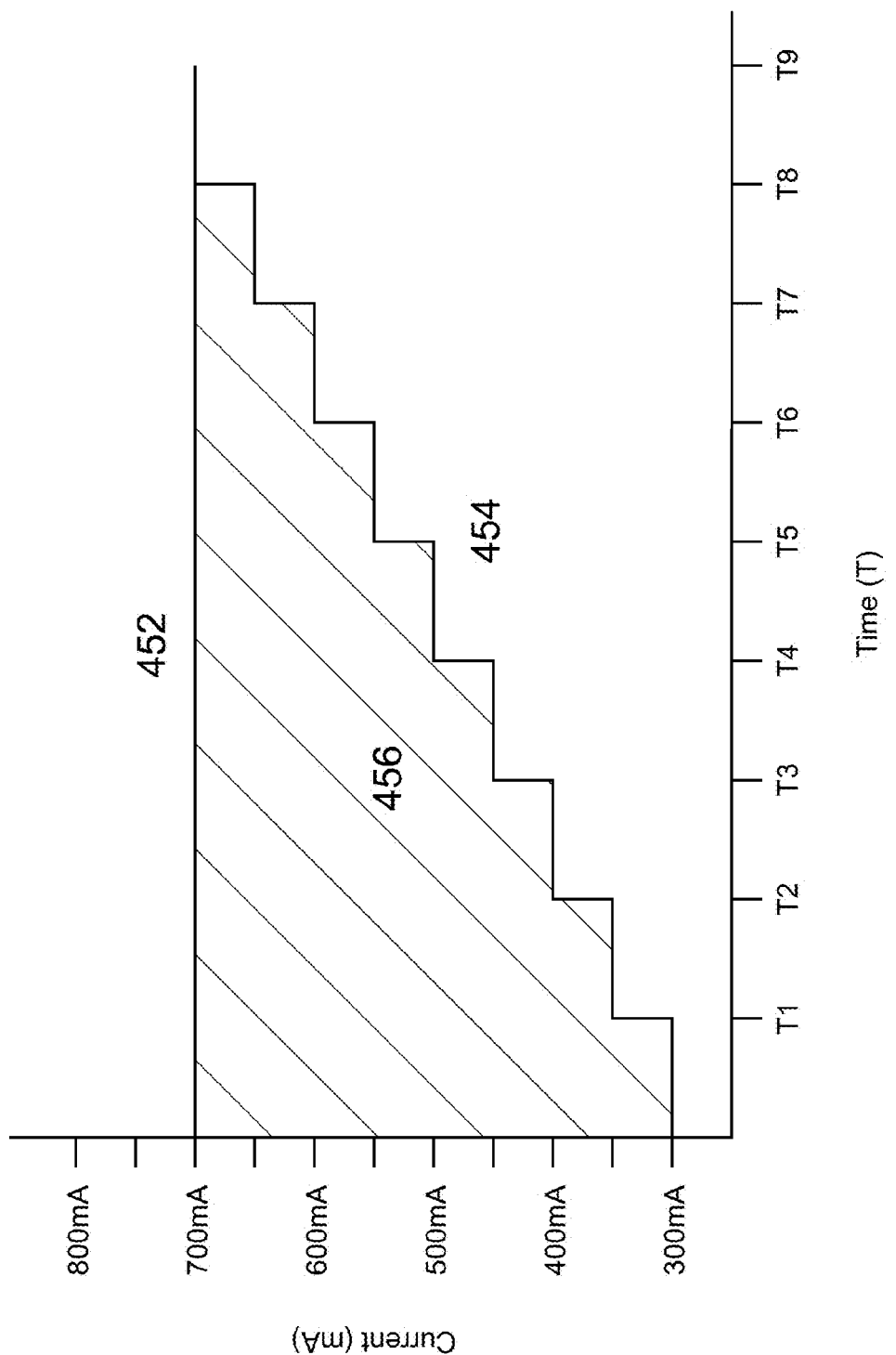

INTERMITTENT OVERDRIVE FOR SPORTS LIGHTING

I. BACKGROUND OF INVENTION

Field of Invention

Some embodiments of the present invention generally relate to lighting systems. More specifically, some embodiments of the present invention relate to LED and other solid-state lighting fixtures and devices.

Background

Lighting needs for sports can vary based on usage. Lighting levels for broadcasting may need to be 50-100% higher than for practice or for non-broadcast games. Thus lighting levels that are quite adequate for play may be insufficient for television broadcasting; this can be true even if players and spectators are completely satisfied with the lower, non-broadcasting lighting level and even if they do not perceive an improvement in lighting at the higher broadcasting level. Lighting systems therefore are normally configured for the highest lighting level required. This means that even though a field or arena may be used for practice or non-broadcast games almost all the time, and even though the need for high level lighting is typically a small fraction of the total field or arena usage, measured in tens of hours per year, the lights are operated at a high level for sometimes hundreds of hours per year. Thus if there were a way to reduce lighting levels during non-broadcast times, this could result in significant potential savings on energy usage, which could be on the order of 25-50% or more annually.

Additionally, with the adoption of LED lighting sources, further opportunities are presented relative to high intensity discharge (HID) systems, which have been the state of the art. HID systems use HID lamps (e.g. metal halide or sodium) as the light sources. HID lighting particularly does not allow much variance in lighting levels. For a nominal 1500 Watt (1500 W) HID lamp, it might exhibit a somewhat proportional relationship between power and light output from around 1300 W to around 1700 W. But as power is reduced below around 1300 W, light levels drop disproportionally with additional decreases in power. For example, the product known as MULTIWATT™ from Musco Corporation of Oskaloosa, Iowa, USA, operates a nominal 1500 W HID lamp at 1500 W for full power and at 1000 W for reduced power. See also U.S. Pat. No. 4,994,718, incorporated by reference herein. The 1000 W setting is only a 33% reduction in power but causes a 50% reduction in light output. Above the high limit (e.g. above 1500 W), light output continues to increase, but lamp longevity drops dramatically with very small additional increases in power, which normally makes increases above the high limit impractical. HID sources also have a well-known lamp lumen depreciation (LLD) characteristic. They lose light output over time of operation.

In contrast, while LEDs can exhibit similar longevity decreases above their high limit for power input, they have the potential to be dimmed to very low levels but with an increase rather than a decrease in efficiency measured in lumens/watt. Also, when LEDs are operated below their high limit, the result is typically an increase in lamp life longevity. This increase can be approximately proportional for slight decreases but can be much higher for larger decreases in operating power. LEDs also have LLD.

Further, due to the ability of LED lighting to operate at a very wide range of power levels, reducing power levels for most of the operational time could result in a reduced number of total fixtures required since fixture count would be determined by a formula based on operational hours at high power versus operational hours at lower power levels. In other words, if less lighting fixtures could supply necessary illumination levels, system costs (both capital and operating) could be reduced.

There is therefore room for improvement in the art. This includes sports lighting (indoors and outdoors) as well as analogous large or wide area lighting applications including, but not limited to, entertainment venues, parking lots, and streets and roadways, and shipping storage yards, warehouses, or any other location where desired lighting levels could vary significantly.

II. SUMMARY OF THE INVENTION

Given lighting needs in this area of the art, the invention addresses and improves on the state of the art.

In particular, aspects of the invention provide for a method, system, and apparatus for adjusting lighting levels in order to provide normal lighting operation for the majority of operating hours with higher or "boosted" or overdriven lighting levels for a minority of operating hours, thereby reducing the required number of lighting units while allowing lower construction and capital costs.

Further aspects of the invention provide a method, system, and apparatus where the power levels used for normal and higher or "boosted" or overdriven operation are varied according to accrued hours of operation and/or other factors related to lamp lumen depreciation.

Further aspects of the invention provide a method, system, and apparatus where remote controls are used to provide input to the lamp operation in accordance with the foregoing aspects.

Further aspects of the invention provide a method, system, and apparatus where operating hours at different light levels are tracked and an estimate of system life is made available.

Further aspects of the invention provide a method, system, and apparatus where there is more than one power level which may be applied before reaching the higher or "boosted" lighting level.

Another aspect of the invention comprises determining operating power to drive LEDs at two distinct individual light outputs estimated such that plural LEDs in the lighting system could cumulatively or compositively meet a minimum light level for a lighting application, while at the same time determining from the operating characteristics of the type of LEDs that driving them for different intermitted cumulative operating times at those two operating powers would likely not require LED source change out over a desired extended period of time. The designer could balance a number of factors, including based on estimations of how operation at different operating powers affect light output and life expectancy of the sources over operating time to select to two distinct light outputs for the LED sources to meet minimum light levels for the lighting application at two different levels. This further allows some adjustment of those operating powers by the designer, if needed, relative to determining number of sources, number of fixtures, and capital costs for components and installation of the lighting system. In one example, the operating powers for the two different light levels for the system can be correlated to a life expectancy for the entire lighting system. Such a life expectancy could be years, perhaps 10 years or more, and even perhaps 20 years or more depending on a variety of factors including predicted practical life span of each of the components of the system.

Another aspect of the invention includes methodology of predicting whether a certain LED light source would be a viable candidate for lighting system for a lighting application that is estimated to need intermittent periods of higher minimum light levels and much greater cumulative times of lower, including substantially lower, normal or basic light levels. The methodology includes determining an extended time span; one example being a desired life expectancy for the lighting system in years. The LED candidate has performance characteristics and data that estimate future performance relative to operating time and power. Such data is available from the LED manufacturer or other sources. Determination is made of likely higher and lower operating power levels to the LED sources to meet the higher and lower composite lighting minimums for the lighting application. The performance data for the LED light source is then used to make an estimated determination whether or not operating the light sources at two different powers for a predicted minority of operating times at higher operating power would likely allow operation of the LED light sources without change out over the desired system life expectancy. Once a candidate LED type is qualified, the designer can fine tune the lighting system in terms of how many LEDs and how many fixtures and what locations relative a target area for the lighting application that would likely meet the minimum higher composite light level at the target area at the higher operating power and the lower basic light level at the target area at the lower operating power. If adjustments are needed in either setting the operating powers or number of LEDs, fixtures, or other components, the designer can do so. This would include leaving the number of LEDs, fixtures and other components as well as the operating powers in place even if they do not necessarily predictably mean the LEDs would survive life expectancy for the system. The designer can balance different factors according to need or desire.

These and other aspects, objects, features, or advantages of the invention will become more apparent with reference to the accompanying specification and claims.

III. BRIEF DESCRIPTION OF THE DRAWINGS

FIG. 1A illustrates in perspective view a typical sports field with LED lighting.

FIGS. 5A-5B are graphs illustrating power versus time curves for an existing method for power control of LED lamps.

IV. DETAILED DESCRIPTION OF EXEMPLARY EMBODIMENTS OF THE PRESENT INVENTION

Background

Predicting LED life or life expectancy based on hours of operation is quite complex and requires that many variables be considered. By "LED life" or "LED life expectancy" it is meant cumulative operating hours of the LED until lamp lumen depreciation reduces light output from the LED so much that the LED is not practical for use in its intended application. Depreciation in output is dependent on many factors including not only power usage, but also thermal conditions; therefore it is not possible to accurately predict lifetime of LED fixtures without knowing specific installation and operational conditions. Among many others, Cree Corporation of Durham, N.C., has described the kinds of calculations and conditions needed to estimate product life for one of its LED types. (See "Thermal Management of Cree® XLamp® LEDs". Application Note CLD-APO5 REV 3B [on-line], Cree, Inc. ©2004-2013. [retrieved on 2013 Sep. 25]. Retrieved from the Internet: <URL:www-.cree.com/xlamp_app_notes/thermal_management>, incorporated by reference herein)," A further example of the types of information readily and publicly available concerning LEDs is data sheet CLD-AP57 Rev 14 covering the XML line of LEDs available from CREE Inc., Durham N.C. For example, such LEDs in a fixture operated at 700 mA might be expected to operate for 50,000 hours if the LED junction temperature remains below 90° C., but might last half as long at 120° C., and might fail in a few hours at 150° C. Therefore, the following example is a hypothetical, based on conditions that could be experienced in the field. Persons having ordinary skill in the art would be able to calculate or estimate similarly for specific conditions and components in actual use.

Figure 1B:
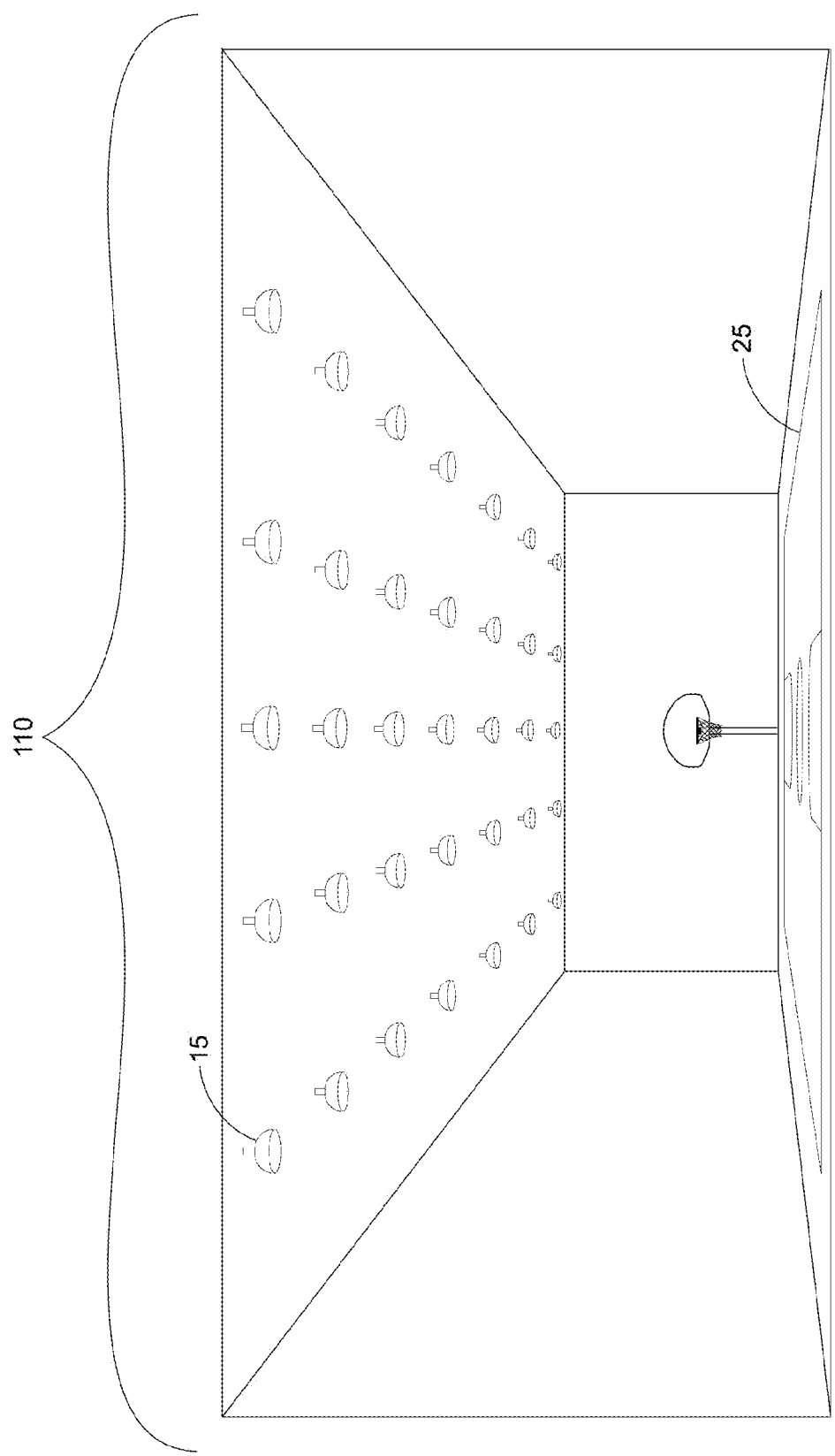
FIG. 1B illustrates in perspective view a typical indoor arena with LED lighting.

Consider an exemplary lighting system 100, FIG. 1A, located at a sports field 20, using LED fixtures 10; or a similar exemplary lighting system 110, FIG. 1B, located at an indoor court 25, using LED fixtures 15. These venues are illustrative of two of the types of locations that would use sports (or analogous) lighting, and which would typically use similar types of fixtures 10 and 15, the fixtures having a nominal life expectancy of 50,000 hours at 700 mA power, and having a nominal life expectancy of 5,000 hours at 1400 mA power. The LEDs produce light roughly in proportion to power input, so light output at 700 mA would be approximately 50% of light output at 1400 mA (one example is an LED having a nominal output of 260 lumens (lm) at 700 watt of operating power). Used for a basketball court or gymnasium, the needs for lighting might be 20 games a year at an average of 2.5 hours per week=50 hours per year, and an average of 30 hours per week for 50 weeks=1500 hours per year for practice, for a total of 1550 hours per year. If the system were operated at full power for those 1550 hours, the LEDs of the lighting system (on average) would have a lighting expectancy of only about 3 years. This system would be initially economical, since it would require a low number of LEDs, and consequently a low number of fixtures and a relatively low construction cost as an LED system designed to always produce light at full power. However, with a light source life of only about 3 years, it would have a relatively very expensive lifetime cost since it would require around seven replacements of LEDs in a 25 year life (a typical overall system life or life expectancy, which includes components such as fixture housings, poles or other elevating structure, and electrical circuits and devices that deliver operating power to the LEDs). But in order to eliminate LED changeouts within the desired 25 year life, it would be necessary to reduce power to LEDs to approximate 700 mA. This in turn would require doubling the number of LEDs and fixtures. In some venues this would incur more than double the costs, since it could require much stronger structural supports (e.g. more robust and thus more expensive) for the additional fixtures. Thus, lowering the current to 700 mA would reduce ongoing maintenance costs, but would greatly increase initial costs. The additional LED's would provide the ability to get the equivalent of full power light but at higher capital cost.

Figure 5A:
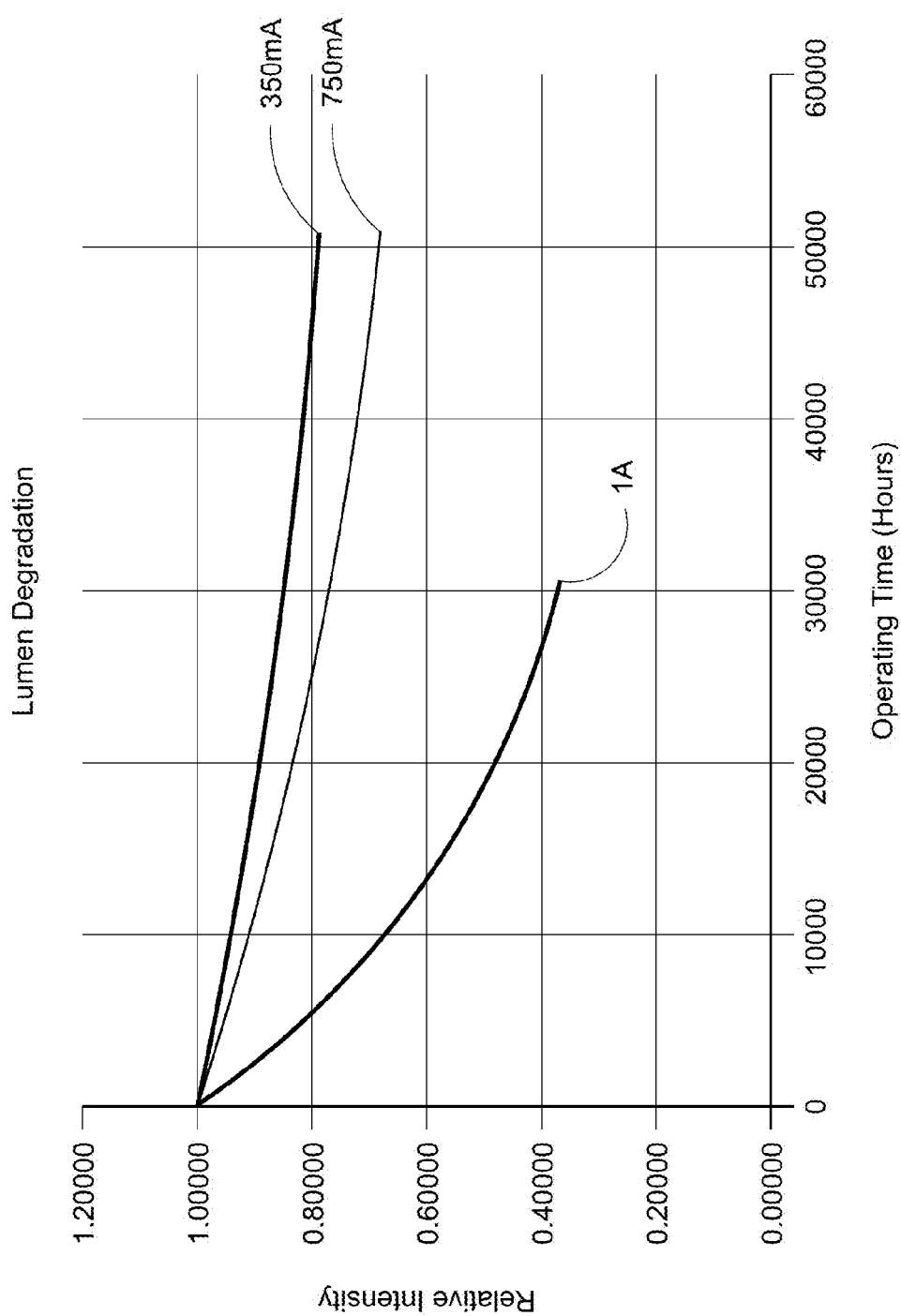
Figure 6A:
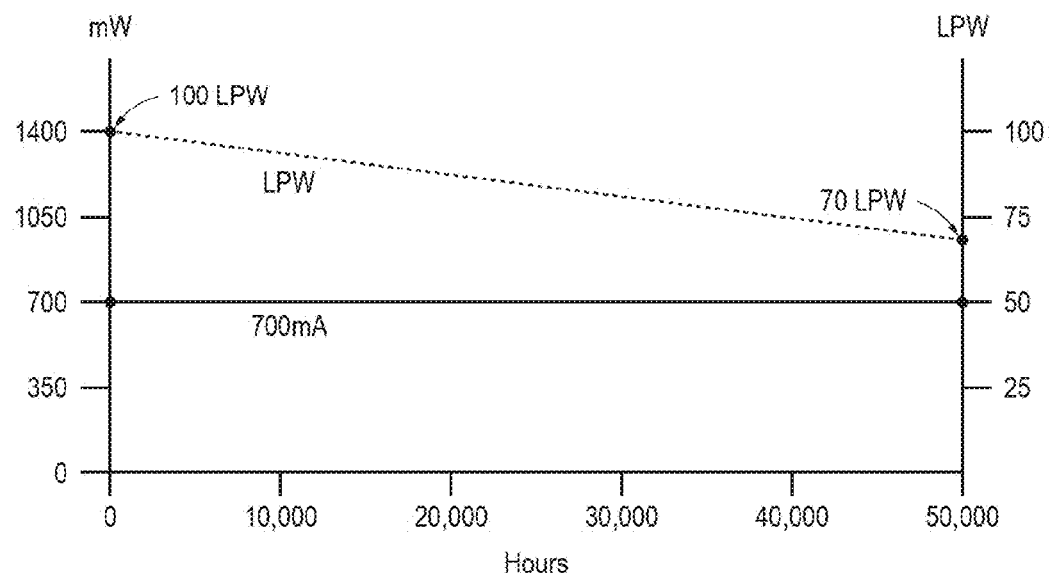
FIGS. 6A-6F are graphs illustrating power versus time curves for methods and embodiments according to aspects of the present invention.
Figure 6B:
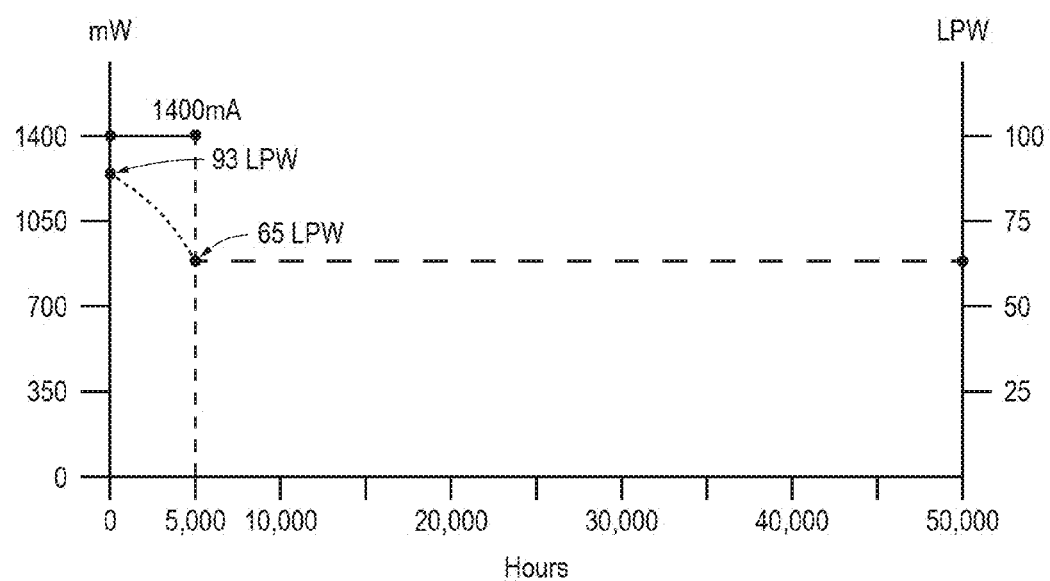

U.S. Pat. No. 7,956,556, owned by the present applicant and incorporated by reference herein, provides useful background on these effects. FIG. 5A (the same as FIG. 22 of the U.S. Pat. No. 7,956,556) illustrates lumen degradation of a representative commercially available LED at 350 mA, 750 mA, and 1 A. According to this graph, the same LED operated at these three different power levels will have depreciated by 30% after about 50,000 hours at 750 mA; but after about only 7500 hours at 1 A. On the other hand, at only 350 mA, the LED has degraded significantly less than 30% even after 50,000 hours, FIGS. 6A and 6B illustrate a similar set of power curves for the exemplary case just discussed. In these graphs, the Y axis (left side) represents power in mW. The X axis (bottom) represents hours of operation, and the Y axis (right side) represents relative efficacy, expressed in lumens per watt (LPW). The LPW figures are arbitrary (with 100 LPW selected to simplify representation) but representative of reasonable expectations for the state of the art. Of course, as known by those skilled in the art, actual values in the field will vary depending on many factors including LED selection, heat sink design, ambient conditions, etc.

FIG. 6A shows an LED being operated at a steady 700 mA for 50,000 hours. LPW begins at 100 and declines to 70 at 50,000 hours. At this point although it continues to emit usable light, the LED is considered (in the context of normal or expected useful life expectancy to those skilled in the art) to have reached the end of its useful life since it has depreciated by 30%. FIG. 6B is similar, showing the same LED being operated at a steady 1400 mA for around 5,000 hours. The LPW value begins at 93 and ends at 65 when it has depreciated by 30% from its original value. However, at the higher power level, the end of life is only approximately 5,000 hours. Note that LEDs are typically less efficacious at higher power so a doubling of power does not necessarily result in a doubling of light output.

Note: In the following discussion, for accuracy and consistency, variables used for purpose of calculating light levels, number of hours of operation, etc. will be described with both a descriptive name and an acronym such as "desired system life (SLT)" for brevity.

For purposes of discussion of methodologies according to the present invention, the foregoing shows that light sources such as LEDs typically have available performance data. By this it is meant that the manufacture or otherwise has information regarding LED types pertaining to such things as are illustrated in FIGS. 5A, 6A and 6B. Thus, a lighting system designer intending to use LEDs usually has a priori information about such things as what type of lumen output from the LED is predicted at what operating power, what loss of lumen output is predicted to occur over cumulative operating time (sometimes referred to as lamp lumen depreciation or degradation or LLD), as well as what level of LLD is predicted to occur along the range of cumulative operating hours at least up to some quite long period of cumulative operating time (usually tens of thousands of hours). This a priori information is well-known to those skilled in the art. It is possible it could be obtained from empirical testing.

As previously mentioned, it is also well-known in the art that LEDs typically can be driven over a range of operating powers with no generally set or recommended operating power. The user of the LED can select from the range of operating powers by balancing the different light output at different operating powers as well as LLD predictions over cumulative operating time. In the context of this description, however, operating power will sometimes be described as "overdriven" or "boosted". This is intended to mean that there is a first lower operating power associated with a first lower lumen output from the LED type. In the context of several of the examples below, this first operating power for the lower lumen output will sometimes be referred to as "normal" or "basic". This differentiates it from the "overdriven" or "boosted" operating power, which would also result in a higher lumen output for the individual LED type for the same number of cumulative operating hours for the LED type. The term "overdriven" or "overdriving" does not, therefore, necessarily indicate any substantial risk to the LED light source other than it is "overdriven" or "boosted" to higher lumen output than if operated at the "normal" or "basic" lumen output for the light source at the same cumulative operating hours.

Therefore, aspects of the embodiments of the invention described herein involve factors related to performance of the individual type of LED light source. They also contemplate using a plurality of those individual LEDs, each having an individual lumen output, in plural lighting units or fixtures. The lighting fixture or unit can have properties and components that direct or redirect light from the individual LEDs in a manner such that there is a composite lighting fixture output. But then further, these examples contemplate plural lighting fixtures that together are configured, positioned, and aimed such that the individual lumen output and lighted distribution outputs of the individual LEDs are controlled at least partially from each lighting fixture and then the individual lumen output and light distribution pattern of each fixture is configured, positioned, and controlled such that compositely all the light fixtures contribute to illumination in the lighting application. One example given herein is producing a composite light level at a sports field that meets a minimum standard. Those skilled in the art know and understand that various authorities or publications or specifications can inform a minimum light intensity level across a sports field for a specific sport or set of sports. As will be discussed further below, different standards can exist for such things as televising a sporting event at a sports field. Such televising normally involves a substantially higher minimum light level at the field.

Figure 2:
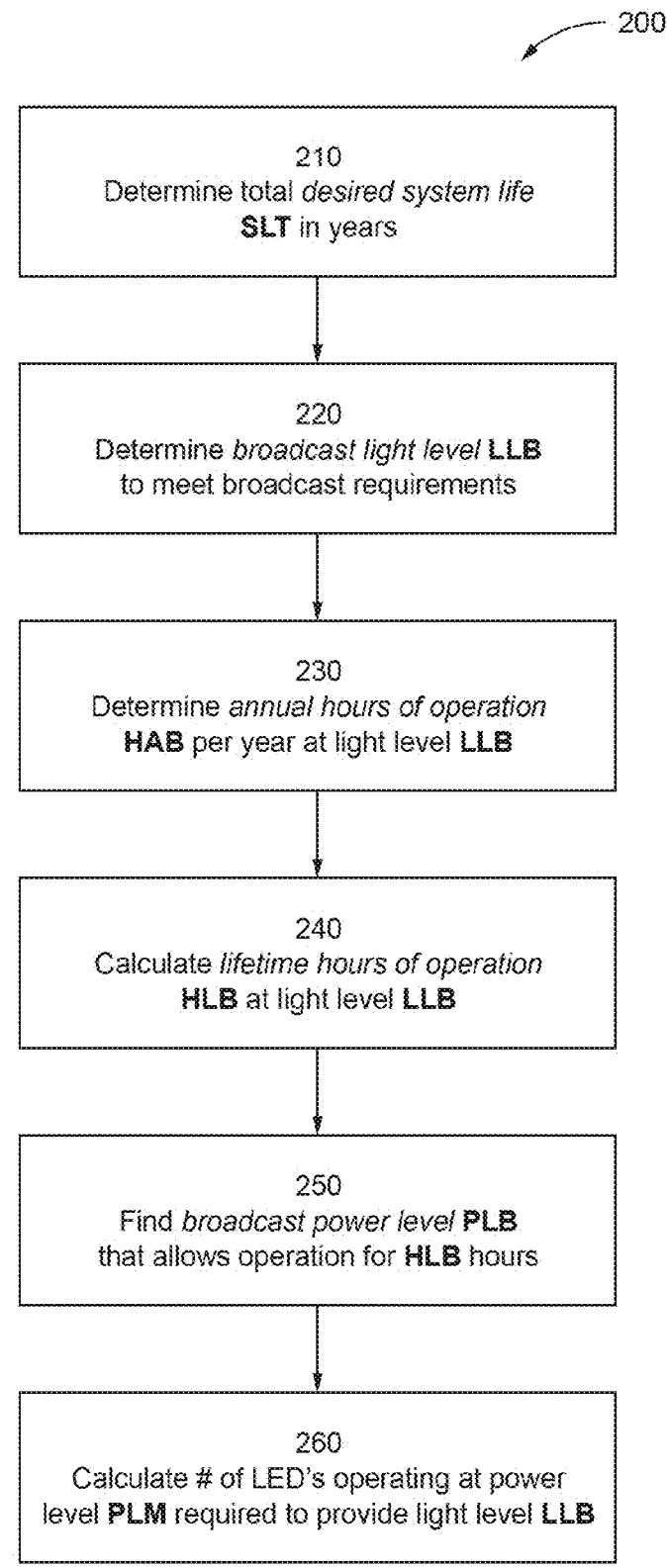
FIGS. 2-4 are flow charts describing methods of operation of LED lighting such as FIGS. 1A and 1B according to aspects of the invention.

The process flowchart 200 illustrated in FIG. 2 illustrates the steps used to determine the number of LEDs required for a lighting system according to this existing model.

First, Step 210: determine the desired system life (SLT) in years; for the system described, 25 years is the desired system life. As can be appreciated, desired system life or system life expectancy can vary from lighting application to application. For example, lighting system life expectancy may look to a desirable length of time that the entire lighting system will be likely to be practically and effectively operable. This brings into play such things as expected life span of poles or other elevating structure to support plural lighting fixtures at the particular lighting application site. This can vary depending on the materials of the elevating structure and its installed environment. It found doors, wind, rain, snow, and other environmental factors can degrade elevating structures more severely and more quickly than indoors. Likewise, lighting fixture housings, mounting hardware, electrical cables, circuit components, reflective surfaces, and other aspects of the components of typical lighting systems can also have estimated effective life spans. Overall system life expectancy can then be estimated sometimes by the weakest component of the system, or the components can be selected to all have a similar life expectancy under the likely operating and environmental conditions the system will end up in. But it is to be understood that desired system life can be set or estimated in a number of different ways including with some subjectivity or somewhat arbitrary standards. On the other hand, how this can be quite objective and quantitative at least in many situations.

Step 220: determine the broadcast light level (LLB) required to provide sufficient illumination of the target area for television broadcasting (or other use requiring a higher than normal level of lighting). By "normal" and "higher than normal" it is meant there is a first lower or basic desired light level to be produced by the lighting system (normal or basic) as compared to a second higher level usually not needed as often as the normal level (higher or boosted)).

Step 230: determine the annual hours of operation (HAB) in hours/year, assuming a single illumination level at broadcast light level (LLB). As can be appreciated, such things as broadcast light level are but one of a variety of different scenarios where two different target illumination light levels might be used or are desirable. But for venues that may be used for televised events from time to time, this is a good example of a scenario where a much higher composite minimum light level is needed for the target area at the venue than most, if not all, other times where the lighting system is needed for the venue. For example, the two different light levels may simply be a higher level for the participants of a competitive game at the field and lower levels for practice. If it's a multi-use venue, the higher level might be needed for either games or practice for a team but if the venue is used for general park purposes or other activities other than sports that do not need as high of a light level, the lower level can be used.

Step 240: calculate lifetime hours of operation (HLB) at broadcast light level (LLB) by multiplying annual hours of operation (HAB) in hours/year by desired system life (SLT) in years. As can be appreciated, the different time periods can vary according to need or desire. System life normally would be years long. The capital costs, installation costs, and operating costs for a lighting system for a wide area such as a sports field or public venue are substantial. Therefore, a system life span or expectancy of years, and better tens of years, such as, this example 25 years, is beneficial for such an investment. However, it is not limited to those types of life spans or could be extended beyond that type of life span.

Step 250: determine broadcast power level (PLB) that allows operation of the lighting system, using the desired LED lights, for the desired number of lifetime hours of operation (HLB). This will be obtained by reading manufacturers' specifications or by testing, etc. to estimate hours of operation versus power levels. As can be appreciated, the designer has some flexibility on selecting operating power levels. In other words, there may not necessarily be an optimal boosted power level and normal power level. It is to be understood that the designer weighs and balances a number of factors. There could be a number of sets of boosted and normal operating powers that could qualify for the same lighting system for the same lighting application.

Finally, Step 260: calculate the number of LEDs operating at broadcast power level (PLB) in order to provide broadcast light level (LLB). This preceding process is designed to provide a usable lighting level and required number of the specified LEDs for the desired system longevity. However, as the current state of the art, it compares unfavorably with the embodiment described below, since it requires more LEDs and associated components.

The general methodology also has implications beyond simply qualifying a type of LED for use in a lighting system or the operating powers and operation times for basic and boosted light levels. If it does satisfy the individual LED life expectancy factor and qualifies the overall system life expectancy factor (e.g. the designer comes up with an acceptable overall lighting system using a plurality of those individual LEDs), the ability to predict that type of LED has the capability collectively or compositely in all the fixtures to meet this "boosted" or higher light level in uniformity minimum for the target for a fraction of total operating time of the LEDs, and qualifies to satisfy the lower or normal light level minimums for the target area and lower operating powers by their use and by design of the fixtures, the placement, elevation, aiming, etc., can in at least some circumstances provide the benefit of both lower capital costs and operating costs.

By way of example and not a limitation, this could mean any one of the following.
 a. lower number of LEDs;
 b. lower number of LEDs per fixture;
 c. lower number of fixtures;
 d. lower number of elevating structures or connections or less costly elevating structures or connections (e.g. cheaper structural materials because they need to support less fixtures).

As is well-known to those skilled in the art, a variety of computer programs allow the designer to simulate on a computer different lighting system configurations. For example, the designer can enter the basic target area dimensions and minimum lighting levels for that target area. The program can assist in designing or even suggesting what type of light output and distribution patterns from fixtures position in what elevations, locations, and orientations relative the target area to meet those minimum light level standards. A subtlety of the methodologies described herein is that the light levels at the target area are relative the lighting system as a whole; i.e., the composite illumination of all the fixtures when operated together. On the other hand, the information relative to an individual light source such as an LED is about that individual light source; i.e., its distribution pattern and lumen output at different operating powers over cumulative operating times. There is no certainty in a certain type of LED being able to meet all the relevant factors desired in a lighting system. For example, an LED having an extremely shorter life expectancy at higher operating powers may not qualify for life expectancy of the lighting system. Or, an LED having a lumen output at higher operating powers that is lower than other LED types may be cost prohibited because to meet the composite lighting level at the field may require so many more of those LEDs. However, in wide area lighting presently, those skilled in the art know basically the general performance needed for LEDs to meet such target area light requirements with a reasonable number of LEDs. Thus, the methodology according to the invention does not necessarily ever need to "qualify" an LED. Most LEDs selected by component designers would likely qualify. The methodology could simply alternatively be used to help the designer set acceptable boosted and normal light outputs from LED sources existing LED fixtures that will have a predicted life expectancy long enough for the lighting application. And, the designer can change or adjust either of those individual LED operating levels. Such changes may affect such things as estimated life expectancy of the sources or composite light levels at the target. But the methodologies described herein all relate to a central notion that if the LEDs only will likely be operated for a fraction of accumulative operating time of the lighting system at boosted levels, the designer can set a normal LED level that is for the majority of accumulative operating time and that could take advantage of such things as longer life expectancy of the LED sources at lower operating powers as well as possibly improved lighting efficiency at lower operating powers. In this sense, if the LED sources only need to be overdriven (driven at a higher operating power) for a small fraction of a total accumulative operating time, any negative effect on such things as LED source life expectancy or efficiency can be factored in and/or compensated.

Figure 3:
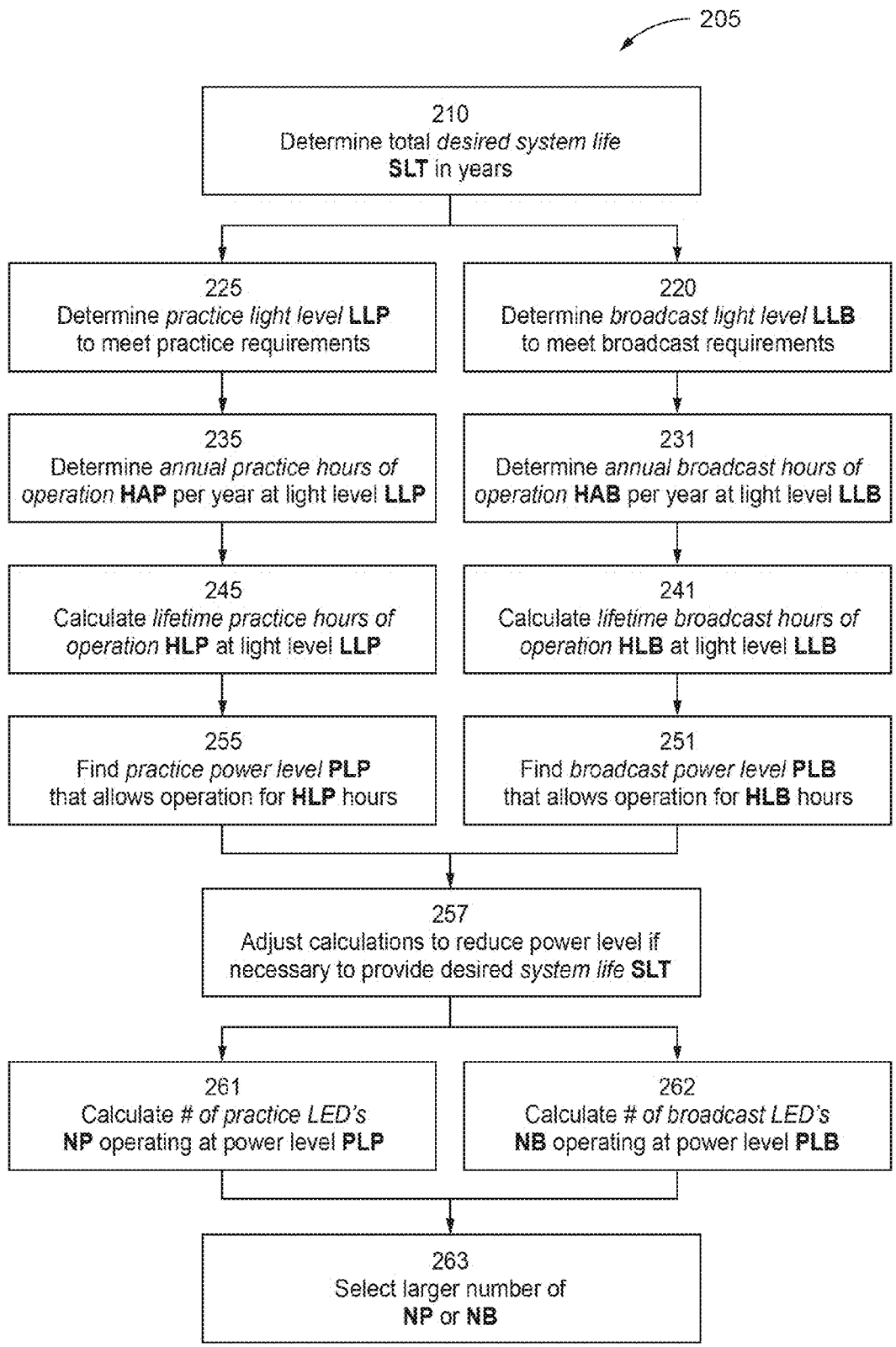

Therefore, as indicated in step 261, 262, and 263 of FIG. 3, if the designer has picked an LED type that likely will qualify for the types of operating powers needed, the designer can use or qualify that LED and use computer programs or other methods known to those skilled in the art to then set the number of LEDs needed for the number of fixtures and their positions to meet the boosted and normal composite light levels at the target (importantly, as indicated by step 263), the designer can also look at whether or not changing the operating powers might beneficially reduce the number of needed LEDs or vice versa. The designer has flexibility of adjusting the lighting system components as well as the number of LED sources and their operating parameters. This includes changing those factors while still meeting the minimum boosted and normal composite light levels at the target area or not. For example, the designer could determine the operating powers and number of LEDs to meet the minimum boosted and normal composite light levels but then decide to reduce the number of LEDs and/or operating power levels for the LEDs. This could be a conscious decision that the minimum composite light levels at the target might not be met now and in the future but it could save capital and installation costs and it could be that less than those minimum levels would be sufficient for the particular application. In other words, the methodology still involves setting different operating powers for boosted and normal levels. The designer can compare the different scenarios and select (usually with the client or customer) what combination is desired.

This can be manipulated in computer program simulations to try to find and balance different factors for each application that could result in more economies along these lines. And, as appreciated by those skilled in the art, if there are less fixtures and/or supplying structures, there could be less installation costs. And, on top of this, less LEDs and/or less fixtures could result in less overall accumulative energy use and thus reduced operating costs. All this is over and above the prominent energy savings that the method contemplates by running the LEDs at a higher or "boosted" operating power only a fraction of the overall accumulative operating time of the LEDs. U.S. Patent Publication U.S. 2006/0176695 A1, goes into detail regarding the possible benefits explained above including not only operating costs but capital costs related to improving light output from a high intensity discharge (HID) lighting fixture by a variety of methods to reduce light loss at the HID source relative to what light actually reaches the target area. Those concepts can be applied as well to the present methodology which can also in the end design reduce the required number of LEDs or fixtures or poles and the like.

The following embodiment according to aspects of the invention as envisioned provides a novel and useful alternative to either of the above configurations.

First Embodiment

The normal state-of-the-art means of adjusting lighting power levels is a "dimming" function. See for example U.S. Pat. No. 4,994,718 incorporated by reference herein. Lights are configured to provide the desired maximum light level. Importantly, this dimming function is the opposite of the present methodology. It configures the high intensity lights to operate at full power except for a fraction of the time where they might be dimmed. Users can dim the lights by reducing power when there is a need for less light; or if there is a perception that light is too bright. However, as long as the lighting level is sufficient, users will rarely be motivated to reduce the power level, even if the actual power level and illumination is much greater than necessary, and even if a significant reduction in illumination level would not result in improved play conditions. Thus in real-world conditions, a lighting system that allowed user-controlled dimming as a normal means of adjustment would likely be operated at highest power, to the detriment of the service life of the lighting system, without appreciable benefit for practice play. According to an aspect of the present invention, and in contrast to the state-of-the-art, the lighting system is configured to operate at a normal (lower than state-of-the-art) level, with a limited access control that can provide a "boosted" (higher level like state of the art) lighting level needed for use with broadcast television cameras or for other occasional needs for high lighting levels.

Thus, this aspect of the invention in a sense does what is opposite of the state of the art. In the state-of-the-art, "normal" is the higher level and less frequently, or in special circumstances, a dimmed level is switched on. In this aspect of the invention, "normal" is the lower level and only in special circumstances (or at least less frequently) is a second level, and higher level, switched in.

LEDs experience "lumen depreciation" over their useful life (e.g. LLD). Most LEDs will not fail by "burning out" but will rather become dimmer over time until it is determined they are no longer providing sufficient light for their intended use. The reduction in efficacy is expressed in terms of percentage of light emitted in comparison with the LED when new. Therefore useful life or life expectancy is often defined in the industry as the number of hours an LED may be operated before they are emitting only 70% of their original level.

In general, the lower the power level an LED is operated at, the greater the longevity. (See, e.g., Cree® XLamp® Long-Term Lumen Maintenance Application Note CLD-AP28 Rev 2 [on-line]. Cree, Inc. ©2008-2013. [retrieved on 2013 Oct. 3]. Retrieved from the Internet: <URL:www.cree.com/xlamp_app_notes/XRE_lumen_maintenance>, incorporated by reference herein; also see e.g. PhilipsTechnology White Paper: Understanding power LED lifetime analysis [on-line; retrieved on 2013 Oct. 3]. Retrieved from the Internet: <URL: http://www.climateactionprogramme.org/images/uploads/documents/Philips_Understanding-Power-LED-Lifetime-Analysis.pdf>, incorporated by reference herein). So if lamps can be operated at a lower power level a large percentage of the time, for instance on the order of 75 to 90% of their "on" time, the relatively few hours each year that they are operated at a higher level will reduce longevity by only a small amount.

Consider a lighting system using LED lamps with a life expectancy that varies according to hours of usage at a given power level. Note that actual results will vary according to specifications of the LEDs and associated components in actual use, so the following figures are nominal values based on possible LED selections and fixture design. FIGS. 5A-6F show a steady operating power over time. If power is varied, life expectancy improves or decreases dependent, at least in substantial part, on the proportion of accumulative time operated at higher power versus lower power. One skilled in the art can extract from the simplified examples how that might be factored in.

Consider then an LED lighting system as previously described, having a nominal life expectancy of 50,000 hours at 700 mA power as seen in FIG. 6A, and a nominal life expectancy of 5,000 hours at 1400 mA as seen in FIG. 6B. Used for a basketball court or gymnasium, the needs for broadcast lighting might be 20 games, each game having an average length of 2.5 hours, per year=50 hours per year. Needs for practice lighting might be 30 hours per week for 50 weeks=1500 hours per year. This would give a combined total of 1550 operating hours per year. If the system were operated at full power for those 1550 hours, the lighting system would have a lighting expectancy of only about 3 years, since total life at broadcast power level is only approximately predicted to be 5000 hours (1,550 hrs/yr×3 yrs=approx. 5,000 hrs). The characteristic is shown in FIG. 6B and is well-known in the art. See, e.g., "Prospects of LED's Technical Evolution". [on-line, retrieved on 2013 Oct. 3]. Retrieved from the Internet: <URL: www.ec.hc360.com/daquan2009/english/secondmenu/Detail_led02e.html>, incorporated by reference herein. However, if instead of operating the lamps 1550 hours per year at 1400 mA, the lamps are operated at 1400 mA for only 50 hours per year (which is effectively about 3.5% of the total hours of operation), then over a desired system life expectancy of 25 years, they have operated only 1250 hours at high power in those 25 years, which is only 25% of the useful life at 1400 mA. (See FIG. 6B.) This could mean that an LED as described, used in this manner would have 75% of its useful life yet available.

Additionally, if the lamps are operated at 700 mA for 1500 hours per year for 25 years, this equals a total of 37500 hours at a much lower power. 37500 hours is only 75% of the lamps' anticipated life expectancy at this lower power level. Therefore the lamps could be expected to last around 25 years if used according to this combined schedule of very few low hours at high power (1400 mA) (approx. 3.2% of 1550 hours) and high hours at low power (700 mA) (approx. 96.8% of 1550 hours).

Figure 6C:
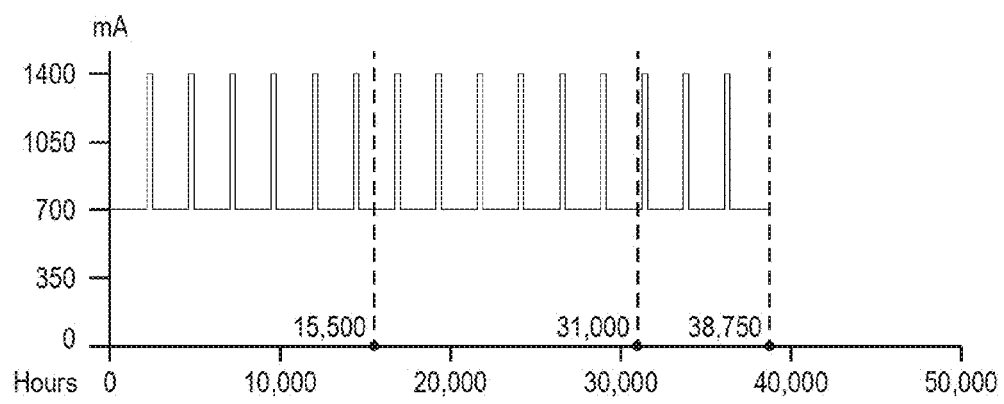

The chart shown in FIG. 6C represents the power levels that would be used plotted against time. The Y (left) axis represents power applied to a representative LED. The X (bottom) axis represents hours of operation. Note that power levels vary between 700 and 1400 mA and that the relative time spent at 1400 mA is very low. As can be seen in FIG. 6C (as well as FIGS. 6D and 6F), over the many thousands and ten thousands of potential cumulative operating hours, the power usage essentially is the square wave with by far a substantial majority at a lower power level with intermediate spikes or square wave increases up to the higher level. These figures give a good (not to scale) representation of a typical mode of operation of the invention where the higher power level is a substantial minority of the overall cumulative operating hours of the light sources. Again, a subtlety of this aspect of the invention is that because the higher operating or "boosted" power levels are needed from time to time, the LEDs are still qualified for this by evaluating whether they can maintain a satisfactory individual light output over the entire life expectancy of the system (25 years) based on the evaluation of whether their quite small or minority of on-time over that extended period of years is indicated to be viable without having to replace the LEDs. Also note that in actual practice the time spent at 1400 mA would typically be interspersed on a daily or weekly basis between the hours spent at 700 mA, however since this would be difficult to represent accurately on a graph, for present purposes this short time period is represented as a 3-4% window at the end of each annual 1550 hour total.

Thus in a situation where "practice" levels of lighting can be on the order of 50% of the "broadcast" lighting level, the system can be sized for operation at 1400 mA level, thereby saving installation and construction costs, but operated mostly at the 700 mA level, thereby significantly reducing ongoing maintenance costs, as well as providing significant reduction in power consumed over the life of the system. By reference also to U.S. Publication US 2006-0176695 A1, it can be seen how cost reductions can apply not only to operation after installation but capital costs and installation costs. (Of course it is recognized that degradation curves may not add up neatly in this fashion, since mechanisms of degradation may not be the same for high power as for low power, and thus expected life might actually be lower or higher than a simplistic calculation would indicate. However, potential conditions are recognized to be quite variable in all cases, so determining the exact balance between hours at low power and hours at high power will vary according to the particular circumstances.)

In order to provide this control, lights may be operated by timers, remote switches, etc., with the power boosting control available only to authorized personnel. Examples of some types of operating power control that is adjustable can be seen at U.S. Pat. Nos. 7,176,635; 7,675,251; 7,956,556; 7,956,551; 8,508,152; 8,098,024; 8,525,439; 6,929,385; 7,982,404; 8,356,916; and 8,449,144; all incorporated by reference herein. Other ways to adjust operating power are well-known, including adjustment to drive current for LEDs as a way of adjusting operating power at the LEDs. And, as intimated herein, actuation of a change in operating power can be accomplished in different ways. One would simply be a manual switch at the lighting system. For example, normal operating power could be a default mode. A user (such as a venue operator) could, when desired, switch some sort of power control component to increase operating power to the "boosted" level for the relatively short intermittent times and return it to default mode. This could be manual or with some settable timer or the like. On the other hand, remote control for one or more lighting systems is possible. Reference can be taken to U.S. Pat. Nos. 6,681,110 and 7,778,635 for examples related to MUSCO Corporation Control-Link® Remote Control Systems for high powered, high intensity wide area lighting systems. Furthermore, it is understood that lighting system applications can relate to sports venues such as outdoor sports complexes or fields or indoor arenas. But also, the invention could be applied to other wide area applications where a lighting system is used. An example could be for entertainment venues that light a substantial space, another example would be parking lights or roadways. See U.S. Pat. No. 8,517,566 regarding high intensity lighting systems of that type, incorporated by reference herein.

Also, it is to be understood that the operating conditions of a lighting installation can affect LED operation. U.S. Published Application US 2012-0081014 A1 discusses how artificial temperature control could be applied to an LED lighting system to help alleviate some operating characteristic concerns related to heat management at LEDs. For example, the physical control could be located out of reach of non-authorized personnel, such as within control box 105, FIG. 1 (e.g. elevated above normal reach of persons on the ground and/or locked), or within a control room with limited access. Or a computerized or automated control system could limit access by password, etc. (Note: Process flowchart 300, illustrated in FIG. 4 and discussed below illustrates one method of operation at varying power levels and with controlled access to "boosted" power levels, according to this embodiment.)

As is well known by those skilled in the art, a significant factor in LED performance is junction temperature. This can be a function of operating power to the LED. It can also involve ambient temperature. Therefore, performance information (e.g. from the manufacturer or experientially or empirically) typically can be obtained or determined as to how thermal management of operation of an LED might affect its curves (the performance over operating time such as FIGS. 5A and 6A-B). This is another factor that the designer would consider in evaluating or designing the lighting system according to the present invention. As an extreme example, if a very good cooling system was a component of the lighting system (which generally would mean substantial cost regarding both components and operation) the life expectancy of LED sources can be substantially increased. However, the designer would have to balance the cost and other factors for such a cooling system with the needs and desires of the client or customer.

The process flowchart 205 illustrated in FIG. 3 illustrates steps used in a method described above. First, Step 210, determine the desired system life (SLT) in years; for the system described, 25 years is the desired system life (SLT).

Step 220: determine the broadcast light level (LLB) in lumens required to provide sufficient illumination of the target area for television broadcasting (or for other use requiring a higher than normal level of lighting); also Step 225: determine the practice light level (LLP) that is sufficient to meet "practice" or other lower light level needs.

Step 231: determine the annual broadcast hours of operation (HAB) required to be at broadcast light level (LLB); also step 235: determine the annual practice hours of operation (HAP) required to be at practice light level (LLP).

Step 241: calculate lifetime broadcast hours of operation (HLB) at broadcast light level (LLB) by multiplying annual broadcast hours of operation (HAB) by desired system life (SLT). Also, step 245: calculate lifetime practice hours of operation (HLP) at practice light level (LLB) by multiplying annual practice hours of operation (HAP) by desired system life (SLT).

Step 251: determine broadcast power level (PLB) that allows operation of the lighting system, using the desired LED lights, for the desired number of total broadcast operating hours lifetime broadcast hours of operation (HLB). This will be obtained by reading manufacturers specifications or by testing, etc. to estimate hours of operation versus power levels. Also, Step 255: find the practice power level (PLP) that allows operation for the desired total number of practice hours HLP.

Step 257: adjust calculations to reduce power level if necessary to provide desired system life SLT. For example, if hours of operation at power level practice power level (PLP) and at broadcast power level (PLB) do not allow for adequate desired system life (SLT), different operating levels will need to be selected to increase anticipated system life to meet or exceed desired system life (SLT).

Step 261: calculate the practice number of LEDs (NP) operating at practice power level (PLP) required to provide practice power level (PLP) and step 262: calculate the broadcast number of LEDs (NB) operating at broadcast power level (PLB) required to provide broadcast power level (PLB).

Finally, step 263: select the larger of the two numbers NP or NB to determine the minimum number of LEDs required to provide illumination with the desired specifications. From there, persons having ordinary skill in the art can calculate the number of fixtures, fixture placement, etc. As indicated previously, those skilled in the art have the ability to use computer simulation programs, experience, or combination of the same to design a lighting system that can use LEDs qualified under the methodologies described previously. That design can further optimize the system in certain circumstances. Also, using computer simulations allows flexibility of the designer to go back and sometimes even change the LED light or its operating parameters and then re-qualifying them.

Figure 4:
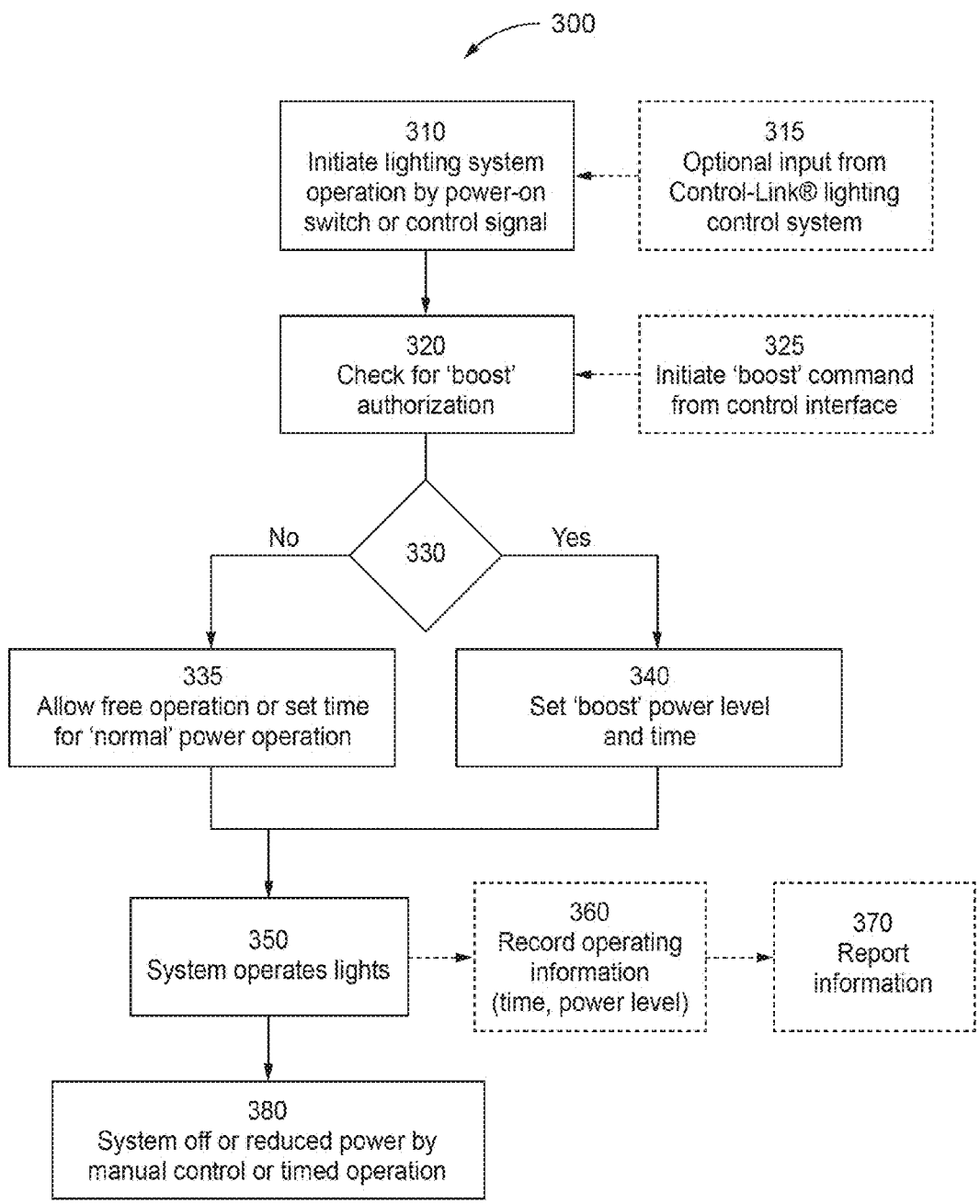

Process flowchart 300, illustrated in FIG. 4, illustrates one method of operation at varying power levels and with controlled access to "boosted" power levels, according to this embodiment. First, step 310: the lighting system operation is initiated; for example, this could simply be by moving a switch or turning a key, or by receiving an 'ON' signal from a remote control system, shown in optional step 315. The operating time and system operating conditions can be monitored and reported via a remote control system. One such control system is CONTROL-LINK®, U.S. Pat. No. 6,681,110 by Musco Corporation Oskaloosa, Iowa, incorporated by reference herein.

Step 320: the system checks for a 'boost' authorization. This could, for example, be from optional input step 325. Decision step 330 branches based on "no" or "yes" answer to the boost authorization check 320. If boost authorization is "no," system is allowed to operate at low power. This operation could be for an unspecified time, controlled by the switch or key, or could be a set time based on other input such as in optional step 315.

If boost authorization is "yes" at step 330, step 340 sets 'boost' power (which could be a single 'high' level in contrast to the normal level, or it could be a stepped or smoothly variable "boosted" power level based on individual requirements of the situation). For example, required lighting levels for different levels of broadcasting or different types of cameras might be different. One or more intermediate "boosted" power levels could further increase the longevity benefits to the system, by allowing somewhat increased power that accelerated system degradation less than full "boosted" power. If boost authorization is "no" at step 330, step 335 simply allows "normal" (lower) operation (essentially a default mode because it is contemplated it would be a substantial majority of the time).

Step 340 could also set the desired time for "boosted" power level, typically a few hours for most sports games.

Step 350: the system is operated according to the operational commands received, until Step 380, when either reduced power is requested by timer, control interface, direct command, etc., or until system is shut off by timer, control interface, direct command, physical switch-off, etc.

Optional Step 360 would allow recording of operating time, power levels, etc. for analysis and record-keeping. Optional Step 370 would allow reporting of the information recorded in Step 360, possibly by use of Musco ControlLink® lighting control system.

Note that the previous figures and examples are intended to be exemplary rather than prescriptive, since individual specifications for LEDs and needs for lighting will vary according to the specific situation.

The system can loop back to step 310 upon next power-on.

Additional Embodiment

Figure 7:
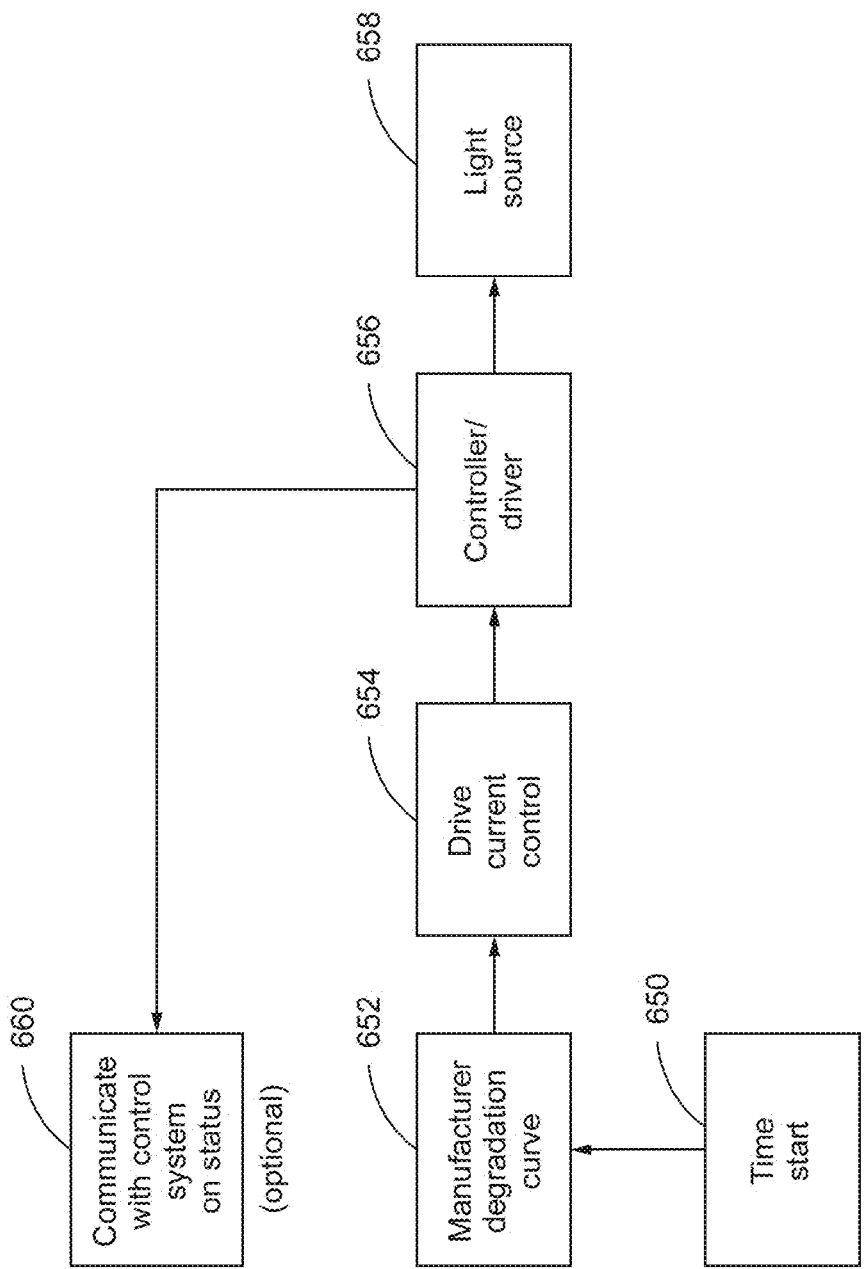
FIG. 7 is a flow chart describing methods according to related art that can be applied to the present invention.

The previously mentioned U.S. Pat. No. 7,956,556 presents a method of operation, used by Musco Corporation of Oskaloosa Iowa and known by its trademark Smart Lamp®, for lighting systems that adjusts power to compensate for lumen depreciation of lamps by starting the lamps at a lower power level and periodically adjusting the power level upwards. One embodiment of the present invention modifies the strategy for the Smart Lamp operational methodology by incorporating specified power levels for different conditions as previously discussed. As discussed in the U.S. Pat. No. 7,956,556, in a general embodiment of that invention, referring to FIG. 7 (essentially the same as FIG. 14 of the U.S. Pat. No. 7,956,556), a timer 650 and the light source manufacturer's light emission degradation data 652 are used to determine the appropriate time to adjust the drive current 654 (by controlling controller/driver 656) to restore light output of the solid state light source 658 to near original output. Optionally, the drive current controller 656 could communicate status information to a control system 660. Current drivers are well-known in the art respective of LEDs. They can have almost infinite adjustability of current and thus operating powered LEDs.

Figure 6D:
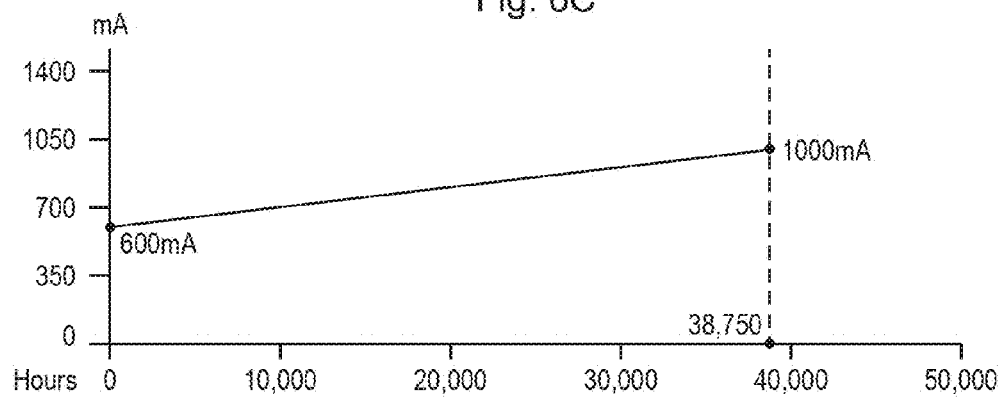
Figure 6E:
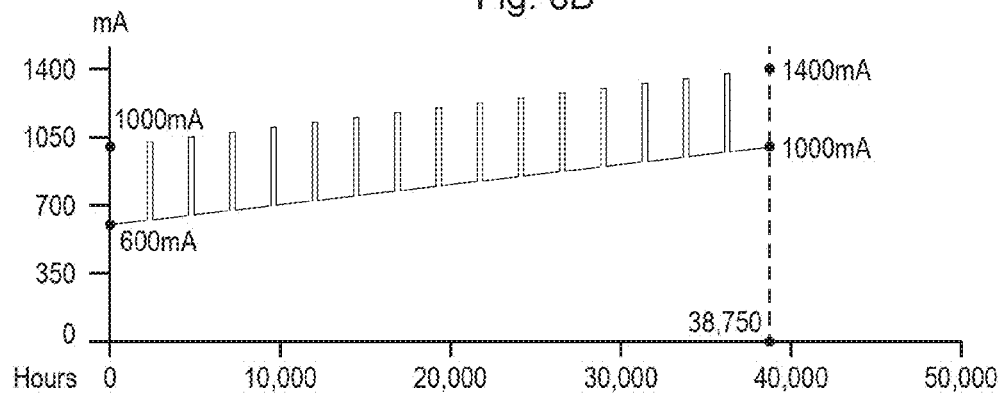

FIG. 5B, which is the same as FIG. 24 of the U.S. Pat. No. 7,956,556, illustrates an exemplary method of operation according to this methodology of periodically increasing power to a lamp. FIG. 6D represents a similar embodiment wherein the power levels are gradually increased in accordance with the U.S. Pat. No. 7,956,556. In this embodiment, power to an LED starts at 600 mA and increases gradually to 1000 mA over a total operational time of 38,750 hours. This has the result that light applied to the target area remains relatively constant even while the efficacy of the LED decreases. However, by itself, this does not accomplish the benefits of the current invention, since the relatively low power levels require roughly twice as many LEDs, and proportionally larger number of fixtures, etc. to achieve the desired "broadcast" light level, as previously described. This again establishes a subtlety of the present invention. On the one hand, individual LEDs (e.g., by type and operating parameters such as a nominal operating power and light output at nominal operating power and levels below that, and further regarding operating parameters related to such things as thermal factors) can be evaluated as a method of "qualifying" a type of LED for use. Then the evaluation can switch to looking at factors relating to qualifying the entire lighting system. Specifically, this means looking at the minimum composite light level and uniformity from the entire lighting system (all of the LEDs for all of the fixtures for all of the poles or elevating structures as aimed to the target area). This involves a composite look at what the whole lighting system would do relative to both "boosted" minimum light levels and uniformities at the target end normal levels. This must take into account each of the individual outputs from each of the plurality of qualified LEDs as discussed above. On the other hand, an explicit "qualifying" step for light sources may not be necessarily needed. Instead, the designer may know or predict that a given LED will satisfy any set of operating conditions contemplated. The methodology could be used to help set operating power levels for boosted and normal. For example, existing LED lighting system may be known to be able to produce sufficient lumen output compositively to meet minimum lighting standards for the target area. The methodology can be utilized to help the designer select boosted operating power versus normal operating power for predicted boosted time and normal times of operation that meet the needs of the customer. For example, those boosted and normal operating powers could be optimized for best and most efficient use of energy. One embodiment according to aspects of the present invention that also uses the principles of the U.S. Pat. No. 7,956,556 operates the LEDs at varying power levels both for practice and for broadcast situations. This is represented by FIG. 6E which shows power levels beginning at 600 mA and increasing slowly to 1000 mA. At the same time, very short periods of broadcast level lighting is supplied, along the same lines as previously described, such that approximately 3-4% of the total time is spent at the higher power level. Note that in this embodiment, the broadcast power level is also reduced initially to 1000 mA and raised slowly to a maximum of 1400 mA. This slow raising is (except for short times at 400 mA) above the previous amount.

Figure 6F:
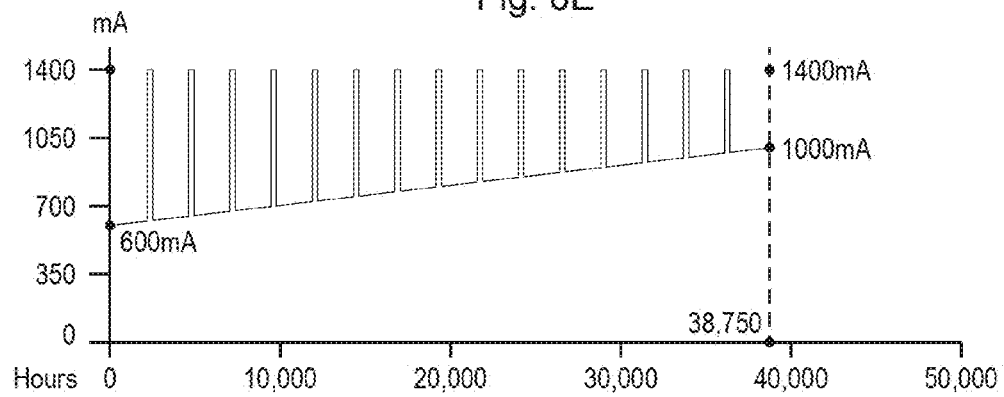

An alternative embodiment is represented by the chart shown in FIG. 6F. Here the practice level of lighting begins at 600 mA and increases slowly to 1000 mA, but the broadcast level of lighting starts at 1400 mA and remains at that level whenever broadcast lighting is enabled. This might be useful or desirable with some lighting situations, perhaps particularly where the percentage of time spent at broadcast levels is very low. Of course, the levels for practice versus broadcast levels could be set independently, either between, above, or below the sorts of limits just illustrated, and the operating strategy could even be adjusted as the lighting system is used and predictions are made through testing or measurement of change in the lighting system output.

Options and Alternatives

Other options and alternatives are possible. One option is including multiple levels of lighting, with one or more further reduced lighting levels for utility or emergency lighting. Another is monitoring hours of operation at normal and "boosted" power, with an estimate of reduction or extension of useful life of system based on actual operation. This or other information obtained through operation could be reported out to a control system interface such as with Control-Link® available from Musco Corporation of Oskaloosa Iowa. See U.S. Pat. Nos. 6,681,110 and 7,778,635 incorporated by reference herein. Other options and alternatives are possible including those obvious to those skilled in the art.

The types of LEDs could vary according to need or desire. The types of lighting fixtures, elevating structures, electrical control circuitry, and the like can vary according to need and desire.

The invention can take on many forms and configurations. Variations obvious to those skilled in the art will be included with the invention.

What is claimed is:

1. A method for adjusting light levels for a lighting application from a wide-area lighting system having a plurality of lighting units, each lighting unit having a plurality of LEDs having an individual light output, over a determined life expectancy of the system, comprising:
   a. providing a first light level from a composite of the individual light outputs of each of the plurality of LEDs operating at a first operating power for the lighting application for a majority of the life expectancy of the lighting system; and
   b. providing a higher, second light level from a composite of the individual light outputs of at least a majority of the plurality of LEDs operating at a higher, second operating power for the lighting application for a minority of the life expectancy of the lighting system;

c. thereby allowing at least one of two distinct lighting levels from the plural lighting units over the life expectancy of the system;
d. tracking operation at both the first and second light levels over the life expectancy; and
e. revising the determination of life expectancy, at least in part, on the tracking.

2. The method of claim 1 wherein the number of hours of operating at the second operating power is variable and selectable.

3. The method of claim 1 further comprising applying multiple intermediate power levels to the lighting system between the first and second light levels.

4. A method of wide area lighting comprising:
a. selecting lighting system components including lighting fixtures each with plural LED sources, elevating structure for the lighting fixtures, and power circuits to supply operating power to the LED sources;
b. determining predicted operating performance for the light sources over a range of operating power and cumulative operating time including:
   i. individual light source life expectancy; and
   ii. individual light source light output;
c. estimating a lighting system life expectancy;
d. installing the lighting system at a target area; and
e. operating the lighting system at different times at higher and lower operating powers estimated from the determined predicted operation performance for the light sources to:
   i. provide higher and lower individual light source light outputs for higher and lower lighting system composite light levels at the target area; and
   ii. provide individual light source life expectancy on the order of lighting system life expectancy;
f. where the step of selecting lighting fixtures each with plural LED sources comprises:
   i. estimating a number of LEDs needed to light said target area to a first illumination level at a first defined operating power and a first defined operating time;
   ii. estimating a number of LEDs needed to light said target area to a second illumination level higher than said first illumination level at a defined second operating power higher than the first defined operating power, and at a second defined operating time lower than the first defined operating time; and
   iii. designing said lighting fixtures to include a number of LEDs commensurate with the larger estimation.

5. The method of claim 4 wherein the wide area lighting comprises sports lighting.

6. The method of claim 4 wherein the LED light source comprises an LED having the following characteristics:
a. a nominal light output of 260 lumens (lm) at 700 mA of operating power.

7. The method of claim 4 wherein the individual light source life expectancy and lighting system life expectancy comprise years.

8. The method of claim 7 wherein the years comprises over twenty years.

9. The method of claim 4 wherein the different times at higher operating powers is a minority of hours relative to at lower operating powers.

10. The method of claim 9 wherein the minority is a substantial minority.

11. The method of claim 4 wherein the higher and lower operating powers for the LED sources are correlated to the providing light output from the individual LED sources that meet or exceed the higher and lower lighting system composite light levels respectively.

12. The method of claim 11 wherein the higher composite light level comprises illumination standards for television broadcast.

13. The method of claim 11 wherein the lower composite light level comprises illumination standards for non-televised activities.

14. A wide-area lighting system such as can be used for illuminating indoor or outdoor sports or entertainment events comprising:
a. a plurality of high intensity lighting fixtures in elevated positions on elevating structures at or near a target area and aimed to provide composite illumination relative the target area;
b. a plurality of light sources in each lighting fixture, each light source contributing to the composite illumination;
c. a control system operatively connected between an electrical power supply and the light sources, the control system including one or more components that can adjust operating power to the light sources at least between a first operating power and a second operating power that is higher than the first operating power;
d. the light sources satisfying a defined system life factor related to operation at the second operating power; and
e. the light sources satisfying a defined system composite illumination light level related to operation at the second operating power; and
f. means to limit access to said control system to prevent unauthorized operating power adjustment.

15. The wide-area lighting system of claim 14 wherein:
a. the defined system life factor comprises:
   i. a system life expectancy in years for the lighting fixtures, elevating structures, and control system; and
   ii. a life expectancy of the light sources which meets or exceeds estimated cumulative operation of the light sources at the second operating power over the system life expectancy.

16. The wide-area lighting system of claim 15 wherein the desired system life expectancy comprises estimating in years likelihood of practical operability of the lighting fixtures, elevating structures, and control system for a given installation location and environment except for routine maintenance.

17. The wide-area lighting system for claim 15 wherein the life expectancy of the light sources comprises an estimation of how long the light sources can produce a light output above a threshold level when operated at the second operating power.

18. The wide-area lighting system of claim 17 wherein the estimation of how long the light sources can produce a light output above a threshold level comprises:
a. an estimated minimum composite illumination light level from all the light sources and lighting fixtures of the wide-area lighting system to illuminate the target area at a higher illumination;
b. an estimated cumulative time needed for higher illumination for the target area over the desired system life expectancy; and
c. an estimated second operating power to each of the light sources to meet the estimated minimum composite illumination light level for the time needed for higher illumination.

19. The wide-area lighting system of claim 14 wherein the light sources are solid state light sources.

20. The wide-area lighting system of claim 14 wherein the second operating power is substantially higher than the first operating power and the control system is configured to provide the second operating power at a substantial minority of the defined system life expectancy.

21. The wide-area lighting system of claim 16 wherein the defined system life expectancy is ten years or more, the life expectancy of the light sources meets or exceed the life expectancy of the lighting system, and the first operating power level promotes lower use of energy and extended light source life expectancy than at the second operation power.

22. The wide-area lighting system of claim 14 wherein the first operating power is substantially lower than the second operating power.

23. A method of operating fir an extended period of time wide area lighting fixtures having light sources that have a light output that increases with operating power comprising:
   a. operating the light sources in a normal mode of operation at a first operating power for a majority of the extended period of time; and
   b, operating the light sources in a boosted mode of operation at a second operating power which is higher than the first operating power for a minority of the period of time;
   c. wherein operation of the lights in the boosted mode is restricted by a control interface requiring (i) authorization, (ii) a defined second operating power level, and (iii) a defined minority period.

24. The method of claim 23 wherein each light source has a light output that is a function of operating power to the light source, and all the light sources and lighting fixtures have a first composite light output when operating, wherein the first operating power is correlated to a composite light output from the fixtures relative a target area that is lower than a second composite light output at the second operating power.

25. The method of claim 24 wherein the first composite light output relates to a light level for practice or untelevised games at a sports field or arena, and the higher second composite light level relates to a light level for televised games at the sports field or arena.

26. The method of claim 23 wherein the second operating power is determined by:
   a. determining a lighting system life expectancy in years;
   b. determining a composite light level from the lighting system for "boosted" mode of operation;
   c. estimating cumulative hours of operation at the "boosted" mode light level for system life expectancy;
   d. determining number of light sources, configuration into the lighting fixtures, and operating power level for the light sources to meet the "boosted" mode light level for system life expectancy and to have a light source life expectancy on the order of the system life expectancy.

27. The method of claim 23 wherein the first operating power is determined by:
   a. determining a composite light level from the lighting system for normal mode of operation;
   b. estimating cumulative hours of operation at the normal mode light level for system life expectancy;
   c. determining number of light sources, configuration into the lighting fixtures, and operating power level for the light sources to meet the normal mode light level for system life expectancy and to have a light source life expectancy on the order of the system life expectancy.

28. The method of claim 25 further comprising:
   a. comparing number of light sources, configurations into the lighting fixtures, and operating power level for "boosted" mode and normal mode and adjusting, if needed, to arrive at a final number of light sources, configuration into the lighting fixtures, and operating power level for "boosted" mode and normal mode.

* * * * *

UNITED STATES PATENT AND TRADEMARK OFFICE
CERTIFICATE OF CORRECTION

| | | |
|---|---|---|
| PATENT NO. | : 9,807,839 B1 | Page 1 of 1 |
| APPLICATION NO. | : 14/049723 | |
| DATED | : October 31, 2017 | |
| INVENTOR(S) | : Myron Gordin and Timothy J. Boyle | |

It is certified that error appears in the above-identified patent and that said Letters Patent is hereby corrected as shown below:

In the Claims

In Column 17, Claim 9, Line 62:
DELETE "at" before lower

In Column 17, Claim 11, Line 67:
DELETE "the" before providing

In Column 19, Claim 21, Line 8:
DELETE "exceed" before the
INSERT --exceeds-- before the In Column 19, Claim 23, Line 15:
DELETE "fir" after operating
INSERT --for-- after operating Signed and Sealed this
Twentieth Day of February, 2018

Andrei Iancu
*Director of the United States Patent and Trademark Office*